United States Patent
Lee et al.

(10) Patent No.: US 10,163,779 B2
(45) Date of Patent: Dec. 25, 2018

(54) INTEGRATED CIRCUIT WITH GUARD RING

(71) Applicant: TAIWAN SEMICONDUCTOR MANUFACTURING COMPANY, LTD., Hsinchu (TW)

(72) Inventors: Chiao-Han Lee, Taichung (TW); Hsien-Yuan Liao, Hsinchu (TW); Ying-Ta Lu, Fanlu Township (TW); Chi-Hsien Lin, Taichung (TW); Ho-Hsiang Chen, Hsinchu (TW); Tzu-Jin Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/303,206

(22) Filed: Jun. 12, 2014

(65) Prior Publication Data

US 2015/0364417 A1 Dec. 17, 2015

(51) Int. Cl.
| | |
|---|---|
| *H01L 23/528* | (2006.01) |
| *H01L 23/00* | (2006.01) |
| *H01L 23/58* | (2006.01) |
| *H01L 23/64* | (2006.01) |
| *H01L 23/522* | (2006.01) |
| *H01L 49/02* | (2006.01) |

(52) U.S. Cl.
CPC ........ *H01L 23/5227* (2013.01); *H01L 23/528* (2013.01); *H01L 23/5286* (2013.01); *H01L 23/562* (2013.01); *H01L 23/585* (2013.01); *H01L 23/645* (2013.01); *H01L 28/10* (2013.01); *H01L 2924/0002* (2013.01)

(58) Field of Classification Search
CPC . H01L 28/10; H01L 23/5227; H01L 23/5226; H01L 23/585; H01L 23/645; H01L 23/5286; H01L 23/564; H01L 2924/19042; H01L 23/562
See application file for complete search history.

(56) References Cited

U.S. PATENT DOCUMENTS

| | | | | |
|---|---|---|---|---|
| 6,921,959 B2 * | 7/2005 | Watanabe | ........... | H01L 23/5227 257/127 |
| 7,999,386 B2 * | 8/2011 | Uchida | ............... | H01L 23/5227 257/759 |
| 8,791,501 B1 * | 7/2014 | Fuentes | ................... | H01L 28/10 257/154 |

(Continued)

*Primary Examiner* — Michael M Trinh
(74) *Attorney, Agent, or Firm* — Hauptman Ham, LLP

(57) ABSTRACT

An integrated circuit comprises an inductor over a substrate and a guard ring surrounding the inductor. The guard ring comprises a plurality of first metal lines extending in a first direction and a plurality of second metal lines extending in a second direction. The second metal lines of the plurality of second metal lines are each coupled with at least one first metal line of the plurality of first metal lines. The guard ring also comprises a staggered line comprising a connected subset of at least one first metal line of the plurality of first metal lines and at least one second metal line of the plurality of second metal lines. The first metal lines of the plurality of first metal lines outside of the connected subset, the second metal lines of the plurality of second metal lines outside of the connected subset, and the staggered line surround the inductor.

20 Claims, 5 Drawing Sheets

(56) References Cited

U.S. PATENT DOCUMENTS

| | | | |
|---|---|---|---|
| 8,836,133 B2* | 9/2014 | Huang | H01L 23/585 257/773 |
| 2014/0367835 A1* | 12/2014 | Wei | H01L 23/562 257/620 |

* cited by examiner

INTEGRATED CIRCUIT WITH GUARD RING

BACKGROUND

On-chip inductors are often used in integrated circuits such as radio frequency integrated circuits ("RFIC"). Guard rings are used to isolate the coupling of on-chip inductors to other on-chip inductors, as well as other circuit components. In one direction (1D) metal routing, guard rings are rectangular-shaped.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
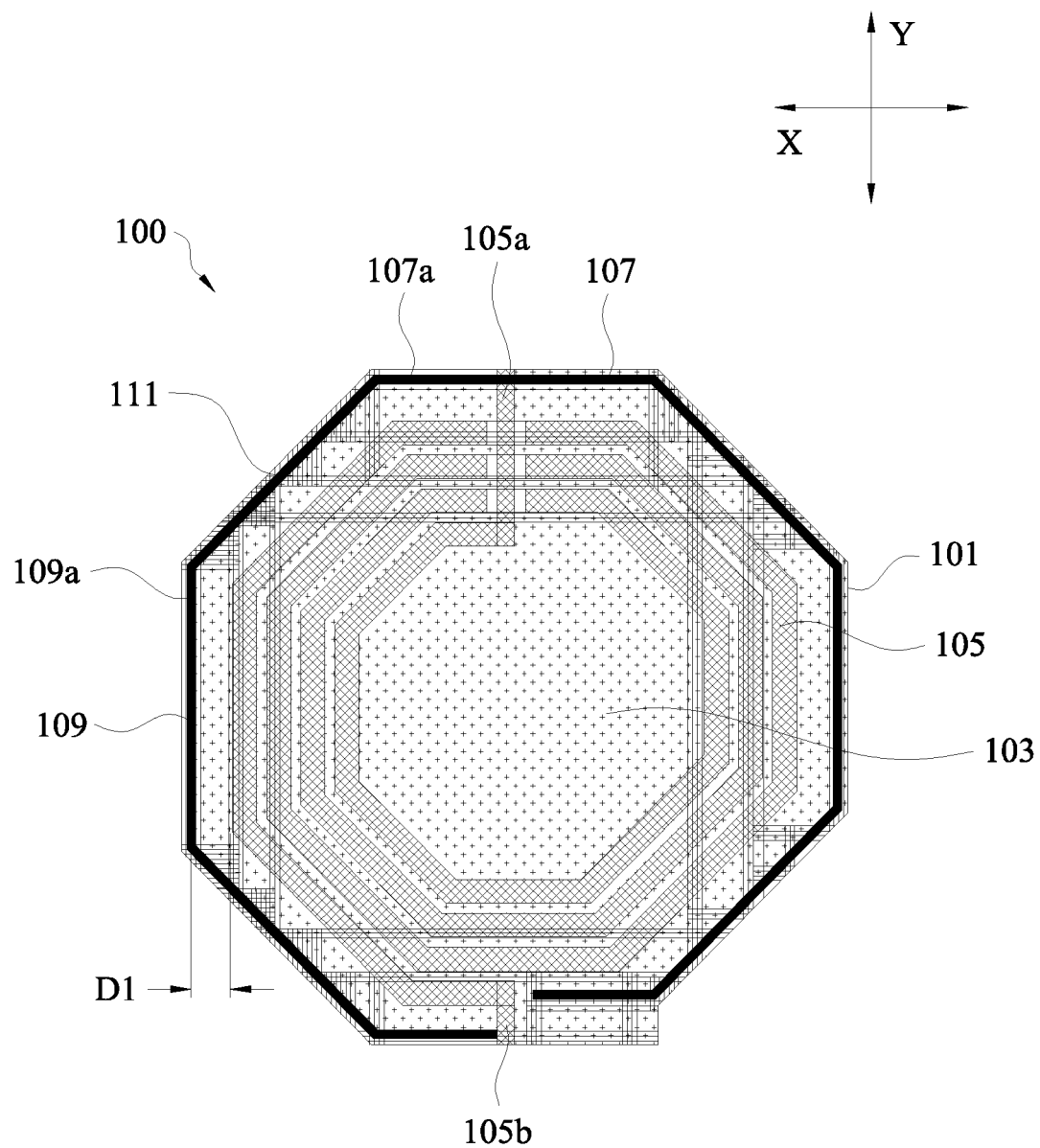
FIG. 1 is a diagram of an integrated circuit with a 1D metal routed guard ring, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Rectangular-shaped guard rings waste space. For example, an integrated circuit that has a rectangular-shaped guard ring for isolating an octagonal-shaped inductor has unoccupied space between the guard ring and the inductor, which results in larger integrated circuit chips than are necessary to perform a given function. This wasted space is compounded and becomes further evident if more than one inductor/guard ring combination is arranged on a same chip. Some integrated circuits are designed based on one-direction (1D) or two-direction (2D) design rules. A 1D design rule describes an integrated circuit feature such as a metal line or layer that is allowed to be routed along a single directional path, for example, in an X or a Y direction. A 2D design rule describes an integrated circuit feature such as a metal line or layer that is allowed to be routed along a directional path that advances in both the X and the Y direction to form a slanted line, for example.

FIG. 1 is a diagram of an integrated circuit 100 with a 1D metal routed guard ring 101, in accordance with one or more embodiments.

Integrated circuit 100 comprises the guard ring 101 over a substrate 103, and an inductor 105 over the substrate 103. The guard ring 101 comprises first metal lines 107a of a first metal layer 107 and second metal lines 109a of a second metal layer 109. The first metal lines 107a are coupled with the second metal lines 109a. One or more of the first metal lines 107a and one or more of the second metal lines 109a are arranged to form at least one staggered line 111 (also referred to as a zigzag or stair step line) that makes up a portion of the guard ring 101. Substrate 103 comprises one or more of silicon, glass, a polymer, an oxide, or other suitable material or combination of suitable materials.

An inductor, e.g., inductor 105, is a passive device which is used to store energy in a magnetic field. Inductors have a measurable inductance (L), which is a measure of the magnetic field generated from a conductor. Inductance varies according to the inductor characteristics such as a number of loops, loop sizes, wire diameter, and other suitable characteristics. In some embodiments, the inductor 105 is a spiral inductor that is a circular, polygonal, or other shaped inductor that is routed in a spiral formation. In some embodiments, the inductor 105 is octagonal-shaped. In some embodiments, the inductor 105 is circular-shaped. In some embodiments, the inductor 105 is triangular-shaped, hexagonal-shaped, trapezoidal-shaped, or other suitable shape. The inductor 105 comprises a conductive material such as a metal, a metal composite, or other suitable material that is formed in one or more metallization layers by one or more of a physical vapor deposition process, a chemical vapor deposition process, a plating process, or other suitable process.

The inductor 105 comprises inductor contacts 105a and 105b. The guard ring 101 surrounds the inductor 105 and makes it possible for the inductor contacts 105a and 105b to be coupled to one or more connections that are outside of the guard ring 101. For example, the guard ring 101 is configured to have one or more openings or partitions through which the inductor contacts 105a/b are coupled to a connection outside of the guard ring 101. The inductor contacts 105a/b are configured to extend above or below the guard ring 101 to facilitate coupling the inductor contacts 105a and 105b to the one or more connections that are outside of the guard ring 101.

In some embodiments, the first metal layer 107 is over the second metal layer 109. In other embodiments, the second metal layer 109 is over the first metal layer 107. The first metal layer 107 and the second metal layer 109 comprise a same or a different material or combination of materials. In some embodiments, the first metal layer 107 and/or the second metal layer 109 comprise a conductive material such as a metal, a metal composite, or other suitable material that is formed by one or more of a physical vapor deposition process, a chemical vapor deposition process, a plating process, or other suitable process.

The first metal lines 107a extend in a first direction X. The second metal lines 109a extend in a second direction Y. The first direction X is perpendicular to the second direction Y.

Two or more of the first metal lines 107a are offset from one another in one or more of the first direction X or the second direction Y. Two or more of the second metal lines 109a are offset from one another in one or more of the first direction X or the second direction Y. The offset first metal lines 107a and the offset second metal lines 109b are together configured to form the at least one staggered line 111. In some embodiments, at least one of the first metal lines 107a included in the at least one staggered line 111 has a first length. In some embodiments, two or more first metal lines 107a included in the at least one staggered line 111 are of the first length. In some embodiments, at least one of the first metal lines 107a included in the at least one staggered line 111 has a length different from the first length. In some embodiments, the first metal lines 107a included in the staggered line 111 have different lengths.

In some embodiments, the at least one of the second metal lines 109a included in the at least one staggered line 111 has a second length. In some embodiments, two of more second metal lines 109a included in the staggered line 111 are of the second length. In some embodiments, at least one of the second metal lines 109a included in the at least one staggered line 111 has a length different from the second length. In some embodiments, the second metal lines 109a included in the staggered line 111 have different lengths. In some embodiments, the first length is equal to the second length. In other embodiments, the first length is different from the second length.

In some embodiments, one or more of the first metal lines 107a and one or more of the second metal lines 109a included in the at least one staggered line 111 overlap.

The arrangement and configuration of the first metal lines 107a and the second metal lines 109a included in the at least one staggered line 111 form a guard ring 101 having the same shape as the inductor 105 while being in conformance with a 1D design rule. For example, a combination of first metal lines 107a and second metal lines 109a, are capable of being arranged to form a guard ring 101 that is octagonal, circular, trapezoidal, elliptical, triangular, parallelogram, hexagonal, pentagonal, or other shape such as another polygonal shape, a random shape having a staggered line that is primarily curved alone or in combination with a straight or a staggered line, or other suitable shape. In at least some embodiments, the arrangement and configuration of first metal lines 107a and the second metal lines 109a included in the at least one staggered line 111 form a guard ring 101 that is a different shape from the inductor 105 while being in conformance with a 1D design rule.

To form an octagonal guard ring 101, for example, the guard ring 101 includes four staggered lines 111, two first metal lines 107a that are continuous and have a length greater than the first metal lines 107a that are included in the four staggered lines 111, and two second metal lines 109a that are continuous and have a length greater than the second metal lines 109a included in the four staggered lines 111. In some embodiments, a continuous metal line optionally comprises a series of metal line segments that together form a continuous metal line that has a length greater than one of the metal lines included in the staggered lines 111, for example.

To form a guard ring 101 that is a right triangle, for example, the guard ring 101 optionally includes one staggered line 111, one first metal lines 107a that has a length greater than the first metal lines 107a included in the staggered line 111, and one second metal line 109a that has a length greater than the second metal lines 109a included in the staggered line 111. To form a guard ring 101 that is a triangle other than a right triangle, the guard ring 101 includes two staggered lines 111, and one of one first metal line 107a that has a length greater than the first metal lines 107a included in the two staggered lines 111, or one second metal line 109a that has a length greater than the second metal lines 109a included in the two staggered lines 111.

In some embodiments, the arrangement and configuration of the first metal lines 107a and the second metal lines 109a included in the at least one staggered line 111 and/or otherwise included as a part of the guard ring 101 are arranged to be within a predetermined distance D1 from the inductor 105. In some embodiments, the predetermined distance D1 is uniform around the inductor 105.

The first metal lines 107a first ends and second ends. The second metal lines 109a comprise first ends and second ends. In some embodiments, the first metal lines 107a and the second metal lines 109a overlap at the first ends and the second ends of the first metal lines 107a and the second lines 109a. In some embodiments, other portions of the first metal lines 107a and the second metal lines 109a overlap. In some embodiments, the first metal lines 107a and the second metal lines 109a do not overlap.

Figure 2:
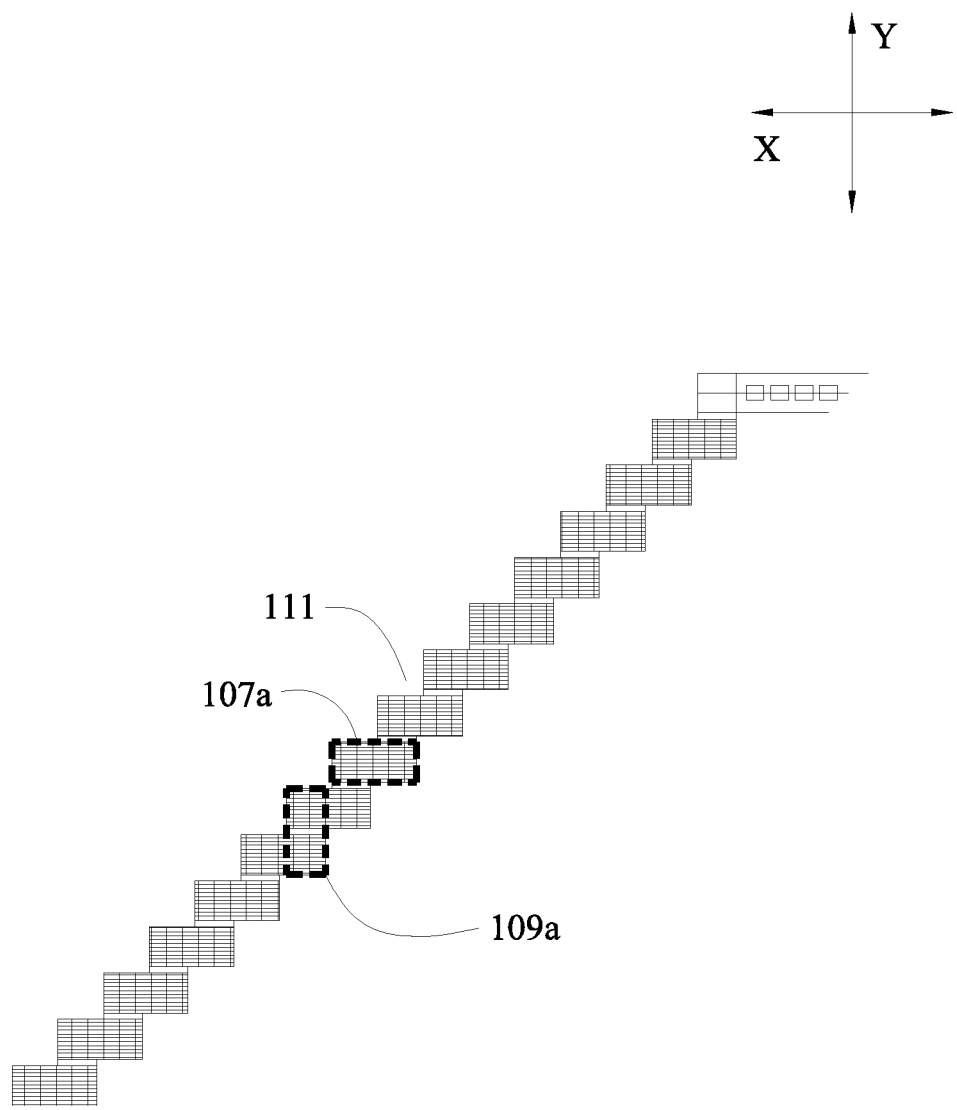
FIG. 2 is a diagram of a staggered line, in accordance with one or more embodiments.

FIG. 2 is a diagram of a staggered line 111, in accordance with one or more embodiments. Staggered line 111 comprises first metal lines 107a and second metal lines 109a. The first metal lines 107a extend in the first direction X and the second metal lines 109a extend in the second direction Y. The first metal lines 107a and the second metal lines 109a are coupled. A guard ring 101 (FIG. 1) that includes one or more staggered lines 111 has performance properties within an allowable process tolerance compared to a guard ring that is formed in compliance with a conventional 2D metal routing rule.

For example, the resistive and capacitive components of the inductor 105 (FIG. 1) may adversely affect a Q-factor (Quality) and FSR (Self-Resonant Frequency) of the inductor. The Q-factor is a measure of the inductor efficiency and is a ratio of the inductance to resistance at a given frequency. A higher Q-factor value indicates a lower rate of energy loss. The FSR of an inductor is the natural frequency in which the inductor oscillates freely. The integrated circuit 100, which is formed in compliance with a 1D design rule, achieves L and Q-factor values that are within a predefined allowable process tolerance compared to an integrated circuit that included a guard ring formed in compliance with a 2D design rule. A 1D design rule compliant integrated circuit having a square or rectangular guard ring that is formed to have the same or similar L and Q-factor values is larger than a 2D design rule compliant integrated circuit. But, unlike conventional 1D design rule compliant integrated circuits that have rectangular or square guard rings, the one or more staggered lines 111 form a guard ring 101 that is the same or similar shape as the inductor 105, such as a guard ring 101 that is octagonal, which reduces the space occupied by the integrated circuit 100 compared to a conventional 1D design rule compliant integrated circuit. For example, in some embodiments, the integrated circuit 100 occupies a space that is 8-12% less than a space occupied by a conventional 1D design rule compliant integrated circuit that has the same or similar L and Q-factor values.

Figure 3:
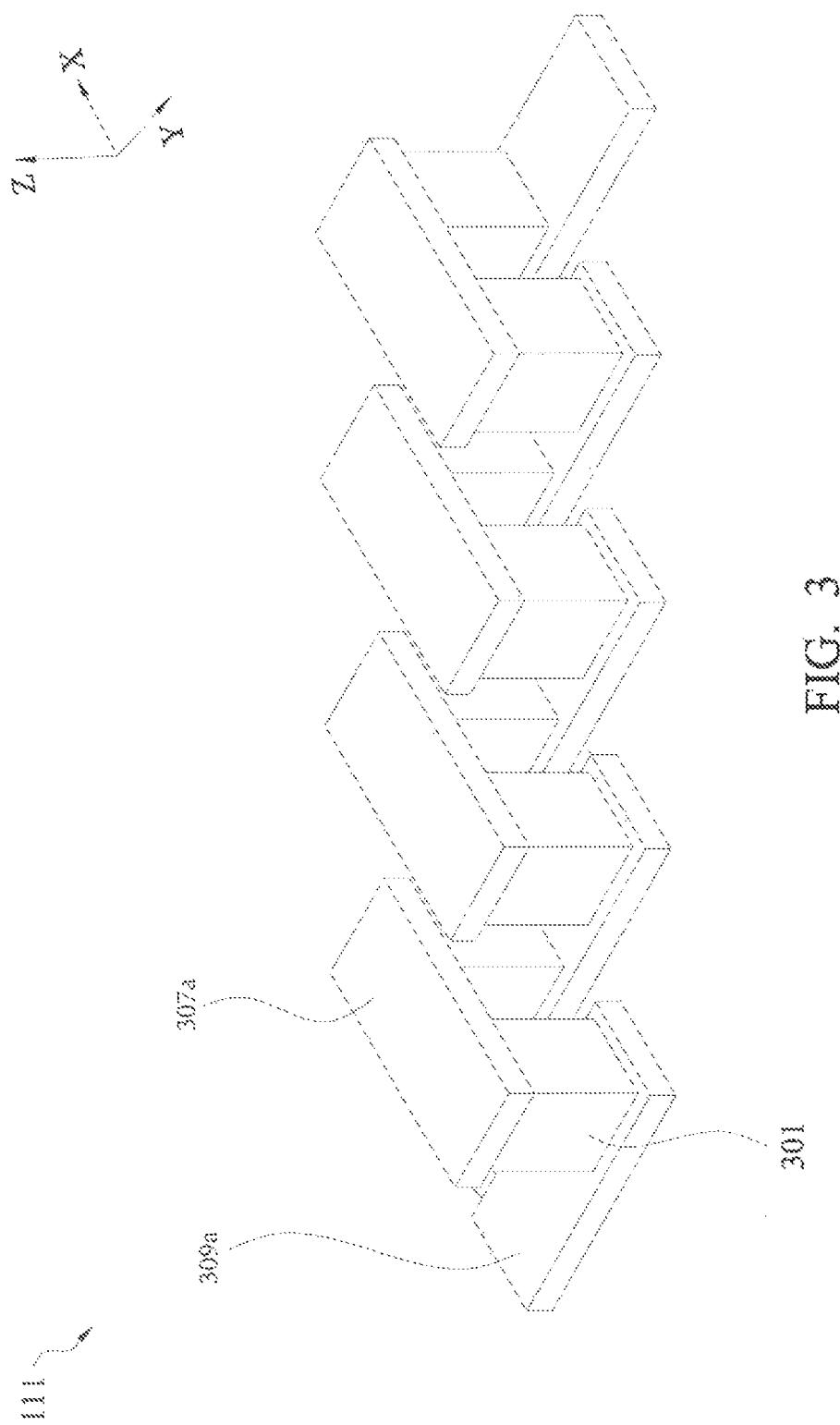
FIG. 3 is a perspective view of a staggered line, in accordance with one or more embodiments.

FIG. 3 is a perspective view diagram of a staggered line 111, in accordance with one or more embodiments. Staggered line 111 comprises first metal lines 307a and second metal lines 309a. The first metal lines 307a extend in the first direction X and the second metal lines 309a extend in the second direction Y. The first metal lines 307a and the second metal lines 309a are coupled by way of vias 301 that extend along a third direction Z. The third direction Z is perpendicular to the first direction X and the second direction Y.

In some embodiments, the vias 301 comprise a conductive material such as a metal, a metal composite, or other suitable material that is formed in one or more metallization layers, through one or more layers, or between one or more layers such as dielectric layers, insulation layers, metallization layers, or other type of layer by one or more of a physical vapor deposition process, a chemical vapor deposition process, a plating process, or other suitable process.

Figure 4:
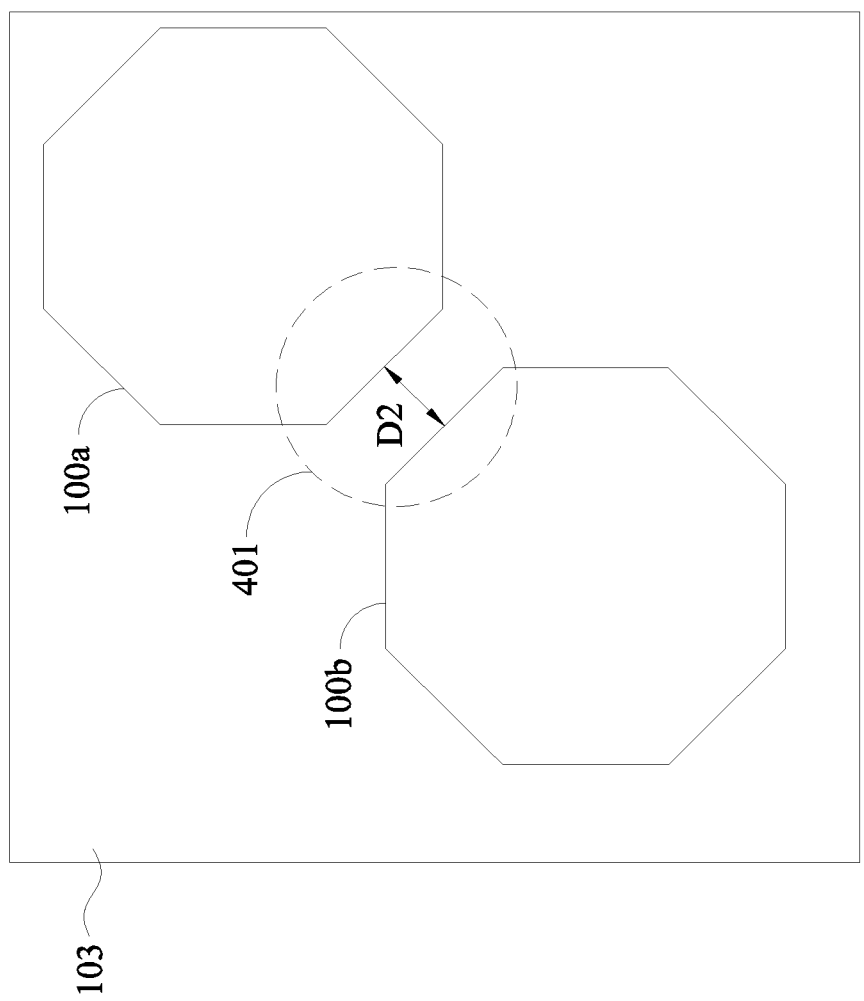
FIG. 4 is a diagram of two integrated circuits in close proximity, in accordance with one or more embodiments.

FIG. 4 is a diagram of a first integrated circuit 100a in close proximity to a second integrated circuit 100b over substrate 103, in accordance with one or more embodiments.

Because the guard rings 101 (FIG. 1) of the first integrated circuit 100a and the second integrated circuit 100b are of the same shape as the inductor 105 (FIG. 1), a space between the inductor 105 and the guard ring 101 is minimized. Additionally, the inductors 105 of the first integrated circuit 100a and the second integrated circuit 100b are capable of being placed closer to one another. In at least some embodiments, the inductors 105 of the first integrated circuit 100a and the second integrated circuit 100b are capable of being placed as close to one another as possible. In some embodiments, a guard ring 101 of the first integrated circuit 100a and a guard ring 101 of the second integrated circuit 100b are arranged on the substrate 103 such that a portion of the respective guard rings 101 are separated by a distance D2 that is from 0 micrometers to about 10 micrometers. Accordingly, the guard rings 101 of the first integrated circuit 100a and the second integrated circuit 100b reduce an area occupied by the first integrated circuit 100a and the second integrated circuit 100b on the substrate 103. In some embodiments, the first integrated circuit 100a and the second integrated circuit 100b have guard rings 101 that share a sidewall, thereby making it possible to further reduce the amount of space occupied by the first integrated circuit 100a and the second integrated circuit 100b on the substrate 103. For example, the sidewalls of the guard rings 101 of the first integrated circuit 100a and the second integrated circuit 100b that are adjacent to one another inside of imaginary circle 401 are capable of being formed as a single sidewall that is sharable between the first integrated circuit 100a and the second integrated circuit 100b.

In some embodiments, more than two integrated circuits 100 are placed near one another over substrate 103. In some embodiments, the overall shape of the integrated circuits 100 that are placed near one another over substrate 103 are the same shape. In other embodiments, the overall shape of at least one of the integrated circuits 100 that are placed near one another over the substrate 103 are different shapes such that a space occupied by the integrated circuits 100 on the substrate 103 is minimized.

Figure 5:
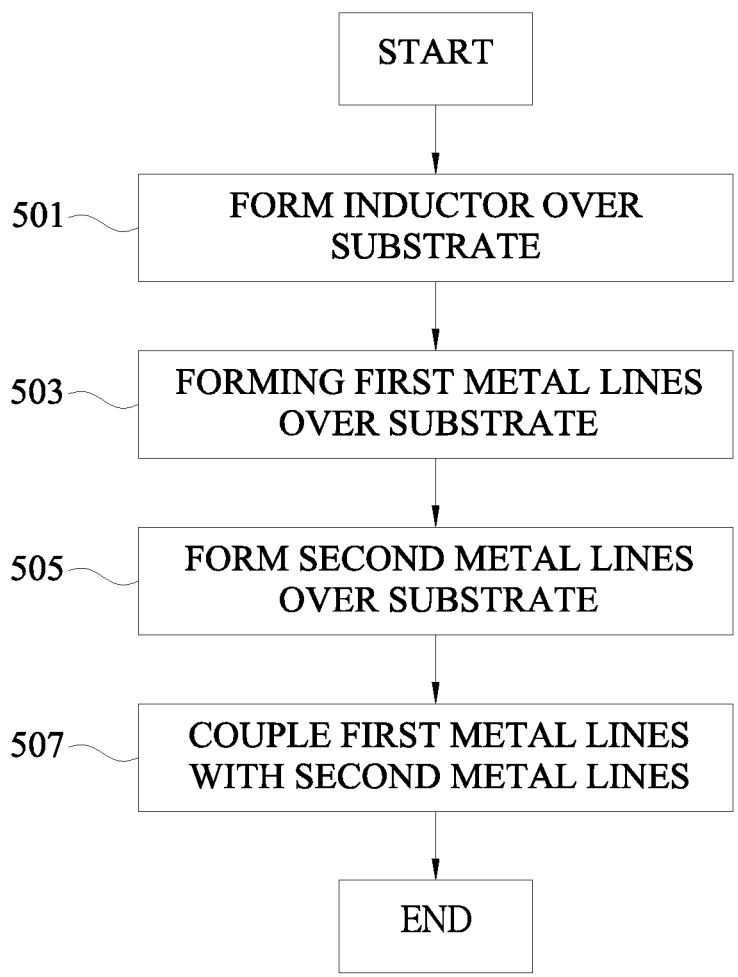
FIG. 5 is a flowchart of a method of forming an integrated circuit, in accordance with one or more embodiments.

FIG. 5 is a flowchart of a method 500 of forming an integrated circuit, in accordance with one or more embodiments. The method 500 is implemented to one or more of manufacture or design an integrated circuit such as integrated circuit 100 (FIG. 1). If method 500 is performed to design an integrated circuit, the method 500 is implemented by a processor configured to execute a set of computer-readable instructions that interface with a circuit design system to design and render a layout of an integrated circuit having the features discussed herein. In step 501, an inductor such as inductor 105 (FIG. 1) is formed over a substrate such as substrate 103 (FIG. 1). In step 503, first metal lines such as first metal lines 107a (FIG. 1) that extend in a first direction are formed over the substrate. In step 505, second metal lines such as second metal lines 109a (FIG. 1) that extend in a second direction different from the first direction are formed over the substrate. In step 507, the first metal lines are coupled with the second metal lines. In some embodiments, the first metal lines are directly coupled with the second metal lines. In other embodiments, vias such as vias 301 (FIG. 3) are formed coupling the first metal lines to the second metal lines. The first metal lines, the second metal lines, the second metal lines, and the optional vias together form a guard ring such as guard ring 101 (FIG. 1) that at least substantially surrounds the inductor.

An aspect of this description relates to an integrated circuit that comprises an inductor over a substrate a guard ring surrounding the inductor. The guard ring comprises a plurality of first metal lines extending in a first direction over the substrate and a plurality of second metal lines extending in a second direction different from the first direction over the substrate. The second metal lines of the plurality of second metal lines are each coupled with at least one first metal line of the plurality of first metal lines. The guard ring also comprises a staggered line comprising a connected subset of at least one first metal line of the plurality of first metal lines and at least one second metal line of the plurality of second metal lines. The first metal lines of the plurality of first metal lines outside of the connected subset, the second metal lines of the plurality of second metal lines outside of the connected subset, and the staggered line are connected to form a shape surrounding the inductor.

Another aspect of this description relates to a guard ring that comprises guard a staggered line comprising a connected set of at least one first conductive line segment and at least one second conductive line segment. The at least one first conductive line segment extends in a first direction and the at least one second conductive line segment extends in a second direction different from the first direction. The guard ring also comprises at least one first conductive line having a length greater than one first conductive line segment. The at least one first conductive line extends in the first direction. The guard ring further comprises at least one of another staggered line, another first conductive line, or at least one second conductive line having a length greater than one second conductive line segment and extending in the second direction.

A further aspect of this description relates to an integrated circuit that comprises an inductor over a substrate, first metal lines over the substrate, second metal lines over the substrate, and vias coupling the first metal lines with the second metal lines. The first metal lines extend in a first direction, and the second metal lines extend in a second direction different from the first direction. The integrated circuit also comprises a guard ring within a predetermined uniform distance of the inductor substantially surrounding the inductor. The guard ring comprises the first metal lines, the second metal lines, and the vias. The guard ring also comprises a staggered line. The staggered line comprises at least one of the first metal lines, at least one of the second metal lines, and at least one via. The staggered line couples a first metal line excluded from the staggered line with a second metal line excluded from the staggered line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    an inductor over a surface of a substrate, the inductor having a first shape;
    a first metal layer over the surface of the substrate;
    metal lines in the first metal layer, wherein all metal lines in the first metal layer extend in a first direction, wherein the first direction is parallel with the surface of the substrate, wherein
        the first direction is a length direction of the metal lines, and a length of each metal line in the first metal layer is greater than a width of each metal line in the first metal layer;
    a second metal layer over the first metal layer; and
    a guard ring surrounding the inductor, the guard ring having a same shape as the first shape, the guard ring comprising:
        a plurality of first metal lines of the metal lines in the first metal layer;
        a plurality of second metal lines in the second metal layer and extending in a second direction different from the first direction, the second metal lines of the plurality of second metal lines each coupled with at least one first metal line of the plurality of first metal lines; and
        a staggered line comprising a connected subset of at least one first metal line of the plurality of first metal lines and at least one second metal line of the plurality of second metal lines, wherein
            metal lines of the plurality of first metal lines outside of the connected subset, metal lines of the plurality of second metal lines outside of the connected subset, and the staggered line are connected to form a shape surrounding the inductor.

2. The integrated circuit of claim 1, wherein at least one first metal line of the plurality of first metal lines is offset from another first metal line of the plurality of first metal lines in one or more of the first direction or the second direction.

3. The integrated circuit of claim 2, wherein at least one of the second metal lines of the plurality of second metal lines is offset from another second metal line of the plurality of second metal lines in one or more of the first direction or the second direction.

4. The integrated circuit of claim 3, wherein the staggered line further comprises the at least one first metal line of the plurality of first metal lines and the at least one second metal line of the plurality of second metal lines that are offset.

5. The integrated circuit of claim 4, wherein the connected subset comprises more than one first metal line of the plurality of first metal lines, and the first metal lines of the plurality of first metal lines included in the connected subset have an equivalent first length.

6. The integrated circuit of claim 5, wherein the connected subset further comprises more than one second metal line of the plurality of second metal lines, and the second metal lines of the plurality of second metal lines included in the connected subset have an equivalent second length.

7. The integrated circuit of claim 6, wherein the equivalent first length is equal to the equivalent second length.

8. The integrated circuit of claim 1, wherein the guard ring is within a predetermined distance from the inductor.

9. The integrated circuit of claim 8, wherein the inductor is a spiral inductor that is one of circular or polygonal.

10. The integrated circuit of claim 8, wherein the predetermined distance between the guard ring and the inductor is uniform around the inductor.

11. A guard ring comprising:
    a staggered line comprising a connected set of a plurality of first conductive line segments and a plurality of second conductive line segments, wherein
        all first conductive line segments of the plurality of first conductive line segments in the connected set are in a first metal layer over an upper surface of a substrate, and all first conductive line segments of the plurality of first conductive line segments extend in a first direction,
        all second conductive line segments of the plurality of second conductive line segments in the connected set are in a second metal layer over the first metal layer, and all second conductive line segments of the plurality of second conductive line segments extend in a second direction, different from the first direction,
        all first conductive line segments of the plurality of first conductive line segments and all second conductive line segments of the plurality of second conductive line segments are parallel to an upper surface of the substrate, and
        the first and second directions are respective length directions of the first conductive line segments and the second conductive line segments, wherein the respective length directions are greater than respective width directions of the first and second conductive line segments;
    metal lines in the first metal layer, wherein all metal lines in the first metal layer extend in the first direction, and at least one metal line of the metal lines is coupled to the staggered line;
    at least one first conductive line having a length greater than a length of a first conductive line segment of the plurality of first conductive line segments; and
    at least one of another staggered line, another first conductive line, or at least one second conductive line having a length greater than one second conductive line segment extending in the second direction.

12. The guard ring of claim 11, wherein a conductive line segment of the plurality of first conductive line segments is offset in one or more of the first direction or the second direction from another conductive line segment of the plurality of first conductive line segments included in the staggered line.

13. The guard ring of claim 12, wherein at least one second conductive line segment of the plurality of second conductive line segments is offset in one or more of the first direction or the second direction from another second conductive line segment of the plurality of second conductive line segments included in the staggered line.

14. The guard ring of claim 13, wherein every one of the plurality of first conductive line segments included in the staggered line have an equivalent first length.

15. The guard ring of claim 14, wherein every one of the plurality of second conductive line segments included in the staggered line have an equivalent second length.

16. The guard ring of claim 11, wherein the at least one first conductive line and the first conductive line segment of the plurality of first conductive line segments are in the first metal layer, and the at least one second conductive line and the one second conductive line segment are in the second metal layer different from the first metal layer.

17. The guard ring of claim 11, wherein the guard ring is polygonal.

18. The guard ring of claim 11, wherein at least one first conductive line segment of the plurality of first conductive line segments, the at least one first conductive line, at least one second conductive line segment of the plurality of second conductive line segments, and the at least one second conductive line are electrically coupled.

19. The guard ring of claim 18, further comprising:
a plurality of vias that electrically couple the at least one first conductive line segment of the plurality of first conductive line segments, the at least one first conductive line, the at least one second conductive line segment of the plurality of second conductive line segments, and the at least one second conductive line.

20. An integrated circuit comprising:
an inductor over a substrate;
a first metal layer over the substrate;
a second metal layer over the first metal layer;
first metal lines in the first metal layer, the first metal lines extending in a first direction;
second metal lines in the second metal layer, the second metal lines extending in a second direction different from the first direction;
vias coupling the first metal lines with the second metal lines; and
a guard ring within a predetermined uniform distance of the inductor, the guard ring substantially surrounding the inductor, the guard ring comprising the first metal lines, the second metal lines, and the vias, and wherein all first metal lines in the first metal layer that form part of the guard ring extend in a same direction,
wherein the guard ring comprises a staggered line, the staggered line comprises at least one of the first metal lines, at least one of the second metal lines, and at least one via of the vias, and the staggered line couples a first metal line excluded from the staggered line with a second metal line excluded from the staggered line.

* * * * *